United States Patent [19]

Tsuya et al.

[11] Patent Number: 4,523,966
[45] Date of Patent: Jun. 18, 1985

[54] PROCESS OF PRODUCING SILICON RIBBON WITH P-N JUNCTION

[75] Inventors: Noboru Tsuya; Kenichi Arai; Toshio Takeuchi, all of Sendai, Japan

[73] Assignee: Tohoku University, Sendai, Japan

[21] Appl. No.: 650,569

[22] Filed: Sep. 13, 1984

Related U.S. Application Data

[63] Continuation of Ser. No. 346,589, Feb. 8, 1982, abandoned.

[30] Foreign Application Priority Data

Feb. 9, 1981 [JP] Japan ................... 56-16887

[51] Int. Cl.³ .......................... H01L 21/208
[52] U.S. Cl. ....................... 148/171; 29/572; 148/1.5; 148/172; 148/187; 148/188; 148/189; 264/177 F; 264/212; 427/85; 427/86; 428/620; 428/939
[58] Field of Search ............... 29/572; 148/1.5, 171, 148/172, 187, 188, 189; 264/177 F, 212; 357/2; 427/85, 86; 428/620, 939

[56] References Cited

U.S. PATENT DOCUMENTS

| | | | |
|---|---|---|---|
| 4,152,535 | 5/1979 | Deminet et al. | 29/572 X |
| 4,229,231 | 10/1980 | Witt et al. | 148/1.5 |
| 4,320,251 | 3/1982 | Narasimhan et al. | 29/572 X |
| 4,339,255 | 7/1982 | Ovshinsky et al. | 357/2 |
| 4,363,769 | 12/1982 | Tsuya et al. | 264/212 X |

OTHER PUBLICATIONS

CRC Handbook of Chemistry and Physics, 60th edn., 1979–1980, CRC Press, Inc., Boca Raton, FL, p. B-21.
Carlson, D. E., "Amorphous Silicon Solar Cells", IEEE Trans. on Electron Devices, vol. ED-24, No. 4, Apr. 1977.

Primary Examiner—George T. Ozaki
Attorney, Agent, or Firm—Fleit, Jacobson, Cohn & Price

[57] ABSTRACT

The disclosed process produces a silicon ribbon wafer with a p-n junction, by melting a raw silicon material, ejecting the molten silicon material onto a rotary cooling member so as to produce a silicon ribbon wafer through super-rapid cooling, and applying an impurity element whose polarity is opposite to that of the raw silicon material onto the thus formed silicon ribbon wafer at a temperature of not lower than 600° C. and cooled from said temperature, whereby a p-n junction is formed in the silicon ribbon wafer simultaneously with the production of the fully solidified silicon ribbon wafer.

10 Claims, 10 Drawing Figures

FIG_5
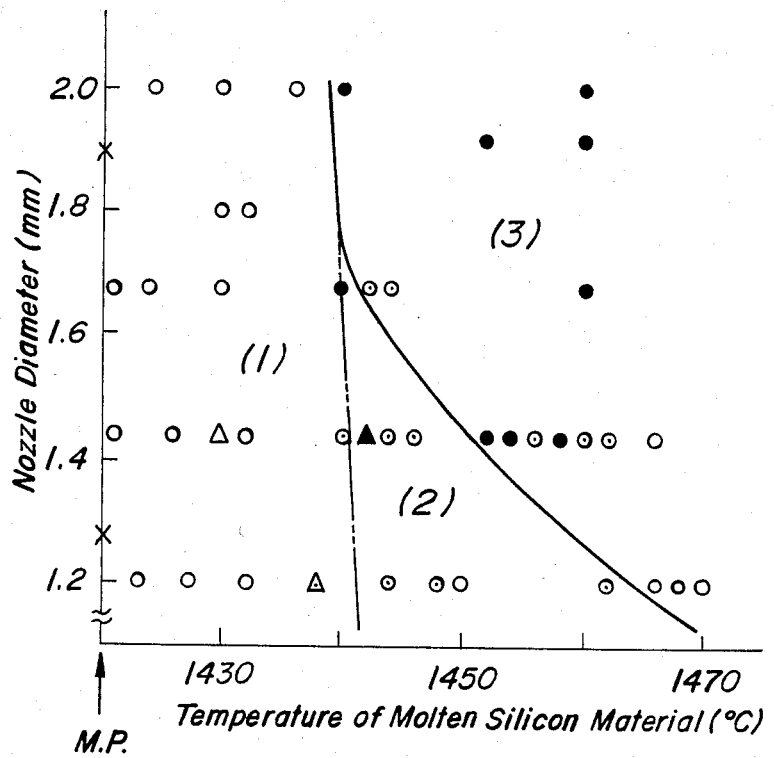

PROCESS OF PRODUCING SILICON RIBBON WITH P-N JUNCTION

This application is a continuation of application Ser. No. 346,589 filed Feb. 8, 1982 is now abandoned.

BACKGROUND OF THE INVENTION

1. Field of the Invention

This invention relates to a process of directly producing a silicon ribbon with a p-n junction formed therein through super-rapid cooling of the melt of silicon material. More particularly, this invention relates to a process of producing a silicon ribber with a p-n junction suitably available for solar cells.

2. Description of the Prior Art

The solar cells, or more precisely photovoltaic cells, have been drawing much attention as one of promising future energy sources of most desirable type, because the solar cells convert sunlight directly into electric energy without using any moving parts, and the solar cells can be operated with easy maintenance and can be readily adapted to remote supervision without any attending residence personnel at site. Besides, the solar cells are formed in module structure, which is suitable for mass production, and their conversion efficiency for generating electricity is substantially constant regardless of the size of power plants composed thereof. The idea of solar cells was proposed by Mr. Chapin in 1954 and theorized next year by Mr. Prince. Numerous experiments on solar cells using silicon (Si) and cadmium sulphide (CdS) as fundamental materials thereof have been reported since then. The energy crisis of recent years has accelerated the studies of the solar cells, and a number of new semiconductor materials other than the above-mentioned fundamental materials have been developed and their viability has been investigated. Examples of such new materials are gallium arsenide (GaAs), the films of indium phosphide (InP), amorphous silicon, cadmium telluride (CdTe), and suitable mixtures thereof. Nevertheless, most researchers of the solar cells generally consider that silicon would be finally selected for practical use due to the following reasons: namely, although silicon solar cells are expensive at the present as the fundamental materials for power plants, considerable cost reduction is possible if a large amount of silicon solar cells are produced on truly mass production basis for residential power sources and commercial power sources; the physical properties of the silicon solar cells have been clarified in considerable detail; and the resource of silicon is abundant.

Conventionally, silicon solar cells have been made by the Czochralski process, the horizontal pull process, or vertical pull process. The conventional processes have a shortcoming in that their production speed is very low. For instance, the horizontal pull process, which is generally considered to be the fastest, produces silicon ribbon at a rate of 15 to 20 cm per minute. If it is assumed that silicon solar cells were used to generate that much power which corresponds to an average growth increment (e.g., about 5%) of the total power consumption in Japan, and if the silicon solar cells are assumed to have a conversion efficiency of 10% and be in the form of 5 cm wide ribbon wafers produced by the horizontal pull process, about 10,000 units of silicon solar cell producing equipment would become necessary. Practicability of such a large number of silicon solar cell producing units is fairly low, so that it can be concluded that, unless the speed of producing the silicon ribbon is improved, the silicon solar cells cannot meet even the average growth increment of the power consumption. Under such conditions, the silicon solar cells hardly claim the position of a viable alternative energy source.

Previously, the inventors succeeded in producing silicon ribbons at a rate of about 70 m per second by a super-rapid melt cooling method, as disclosed in U.S. patent application Ser. No. 961,047, now abandoned in favor of U.S. Pat. No. 4,363,769.

The above-mentioned super-rapid melt cooling method comprises steps of placing raw silicon material in a heat-resisting tube such as a quartz tube with a nozzle, melting the silicon material by an electric furnace, ejecting the melt of the silicon material through the nozzle, i.e., an orifice at the lower end of the heat-resisting tube by applying a high pressure argon gas to the heat-resisting tube onto the circumferential surface of a disk roller revolving at a high speed or twin-roller type cooling substrate; and forming a silicon ribbon by super-rapid cooling of the thus ejected melt. The feature of the super-rapid melt cooling method of producing the silicon ribbon is that the speed of producing the silicon ribbon is more than one thousand times faster than that of the conventional processes such as the horizontal pull process and that the growth process of silicon ribbon is very simple. Besides, the silicon ribbon produced by the super-rapid melt cooling method has a thickness of about 20 to 100 $\mu$m which is best suited to solar cells, and the crystal structure of the silicon ribbon wafer is of columnar crystals with crystal grains extending therethrough at right angles to the ribbon surface, so that the silicon ribbon is free from unstableness experienced in amorphous semiconductor solar cells. Thus, the super-rapid melt cooling method has attracted much interest as one of the most promising candidates for producing the solar cells in the future.

Although the super-rapid melt cooling method produces the silicon ribbon at a high speed such as about 20 m per second as mentioned above, in order to make silicon solar cells, barriers or junctions must be formed in the silicon ribbon wafer in the form of a p-n junction or a Schottky barrier. Unless such junction or barrier is formed quickly, overall high speed efficiency cannot be achieved in fabricating the silicon solar cells to minimize the production cost thereof. Besides, there is a need for further improvement of the super-rapid melt cooling method itself, because the method is not free from considerable unevenness in the surface conditions, the width non-uniformity, and the edge non-linearity of the silicon ribbon wafer produced thereby due to changes in the processing conditions.

Heretofore, the junctions or barriers such as the p-n junctions or Schottky barriers have been formed by the so-called CVD (Chemical Vapour Deposition) method or by spread-diffusion method after the silicon ribbon wafers are produced. For instance, in the spread-diffusion method of the prior art, silicon tetrachloride ($SiCl_4$) dissolved in acetic acid ($CH_3COOH$) is spread on a silicon ribbon wafer, which is prepared by the melt super-rapid cooling method, and the silicon ribbon wafer is then reheated in an argon (Ar) gas atmosphere at about 900° C. for about 30 minutes to one hour. The conventional methods of forming the junctions or barriers in the silicon ribbon wafers have a shortcoming in that their production speed is very low since said reheating is necessary.

More particularly, the speed at which the silicon ribbons are made, such fast making of the silicon ribbon does not mean much in the production of silicon solar cells unless the junctions such as the p-n junctions are formed quickly, possibly simultaneously with the making of the silicon ribbons. For instance, if much time is required in forming the p-n junctions such as by reheating, the production of the silicon solar cells is restricted at the stage of forming the p-n junctions, and the merit of the high-speed production of the silicon ribbon is diluted. Apart from the production speed, smooth surface without undulations or unevenness is an absolute requirement for silicon ribbon wafers to be used in silicon solar cells, because the smooth surface of the silicon ribbon is necessary to produce uniform junctions and to ensure stable bonding of electrodes thereto. In addition, to make solar cells, uniform widths and linear edges of the silicon ribbon are desirable.

SUMMARY OF THE INVENTION

An object of the present invention is to obviate the above-mentioned shortcomings of the prior art and to meet the requirements of the silicon ribbon for silicon solar cells.

In a preferred embodiment of the invention, to produce a silicon ribbon by super-rapid cooling of the melt of silicon material, a starting raw silicon material containing a p-type or n-type impurity is melted and the melt of silicon is ejected and super-rapdily cooled by a rotary cooling substrate so as to produce a silicon ribbon, and during the thus formed silicon ribbon is still at a high temperature of at least more than 600° C. immediately after ejecting the melt, an impurity in liquid- or gas-state is applied to the silicon ribbon by spreading or spraying. Whereby, a p-n junction is formed in the silicon ribbon simultaneously with the production of the fully solidified silicon ribbon. The temperature of the melt of raw silicon material at the time of ejecting is adjusted in a temperature between 0.5° C. and 20° C. above the melting point of the raw silicon material, so that the silicon ribbon produced from the melt of raw silicon material has smooth surfaces, the linear edges of ribbon, and a constant width. The silicon ribbon thus produced is suitable for solar cells and polycrystalline substrates.

In another embodiment of the invention, starting raw silicon material containing a p-type or n-type impurity at a regular concentration is molten in a heat-resisting tube such as a quartz tube, and the melt of silicon material is ejected onto the circumferential surface of a rotary cooling substrate in vacuo or in an argon gas atmosphere through a nozzle formed at one end of the tube so as to cool the ejected melt of silicon super-rapidly into a silicon ribbon of p-type or n-type. When the thus ejected silicon ribbon is still at a temperature higher than 600° C. on said cooling substrate, an impurity of n-type or p-type, i.e., an impurity whose polarity is opposite to that of the starting raw silicon material, is applied onto one side surface of the silicon ribbon by spraying or spreading so that the impurity of the opposite polarity is uniformly diffused and doped in the silicon ribbon at a desired thickness, whereby a p-n junction is formed in the silicon ribbon simultaneously with the production of the fully solidified silicon ribbon wafer.

BRIEF DESCRIPTION OF THE DRAWINGS

For a better understanding of the invention, reference is made to the accompanying drawings, in which:

FIG. 5 is a graph showing the relationship among the temperature of the melt of raw silicon material at the time of ejecting, the nozzle diameter, and the shape of the silicon ribbon formed on cooling substrate;

Throughout the different views of the drawings, 1 is a heat-resisting tube, 2 is an electric furnace, 3 is a rotary cooling disk, 4 is a vacuum chamber, 5 is a bellows, 6 is a melt of raw silicon material, 7 is an argon feeder tube, 8 is an entry gas regulator valve, 9 is an exhaust tube, 10 is an exhaust gas regulator valve, 11 is a nozzle, 12 is a jet flow of silicon melt, 13 is a silicon ribbon thus formed, 14 is a driving motor, 15 is a pinch roller, 16 is an applicator roller, 17 is an impurity vessel, 18 is an air cylinder, 19 is a piston, 20 is impurity, 21 is a heat-resisting tubular vessel, 22 is an electric furnace, 23 is a nozzle, 24 is an argon feeder tube, 25 and 26 are valves, 27 is a plug, and 28 shows twin rollers.

DETAILED DESCRIPTION OF THE PREFERRED EMBODIMENTS

Figure 1:
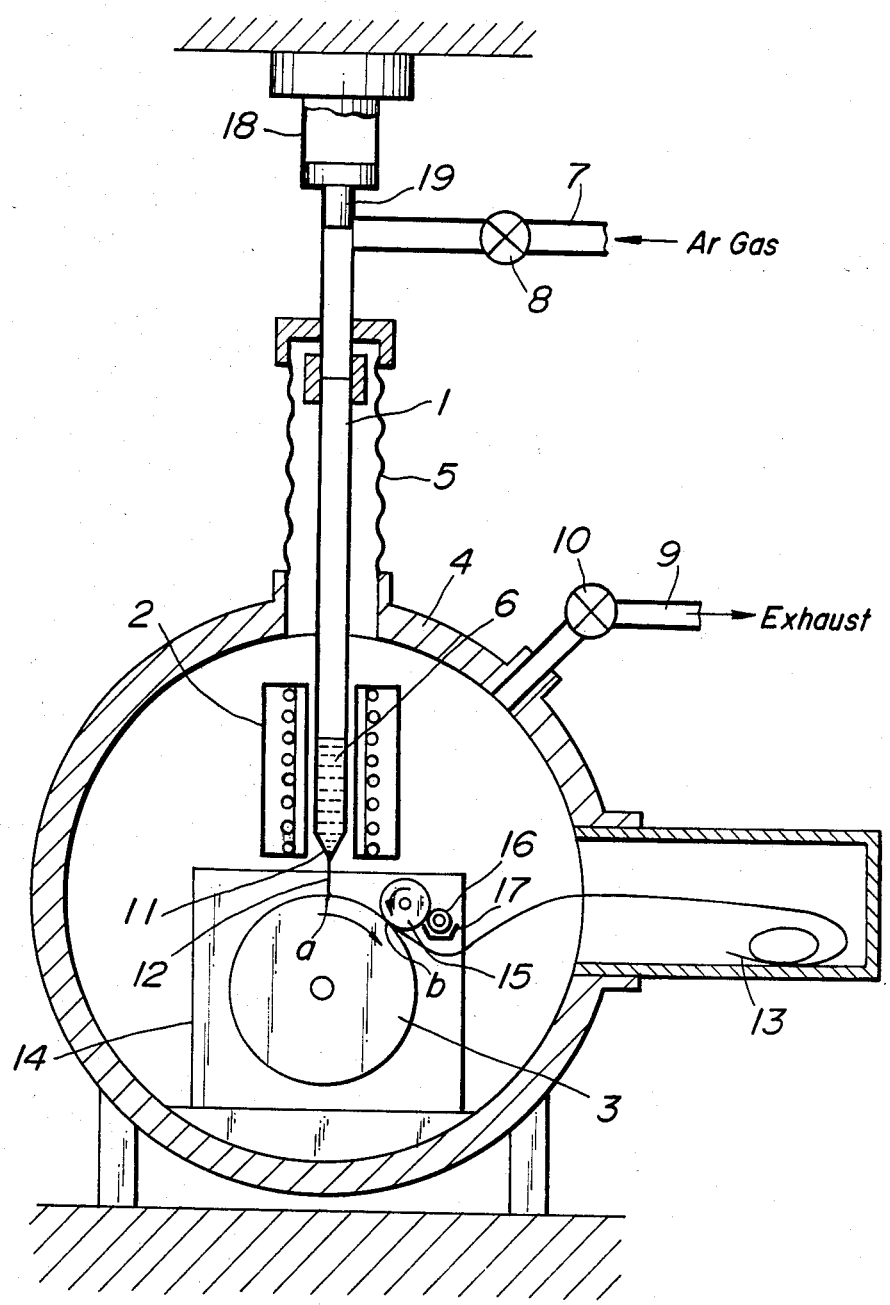
FIG. 1 is a schematic sectional view of an apparatus suitable for producing a silicon ribbon while simultaneously forming a p-n junction therein by a spreading process according to the present invention.
Figure 2:
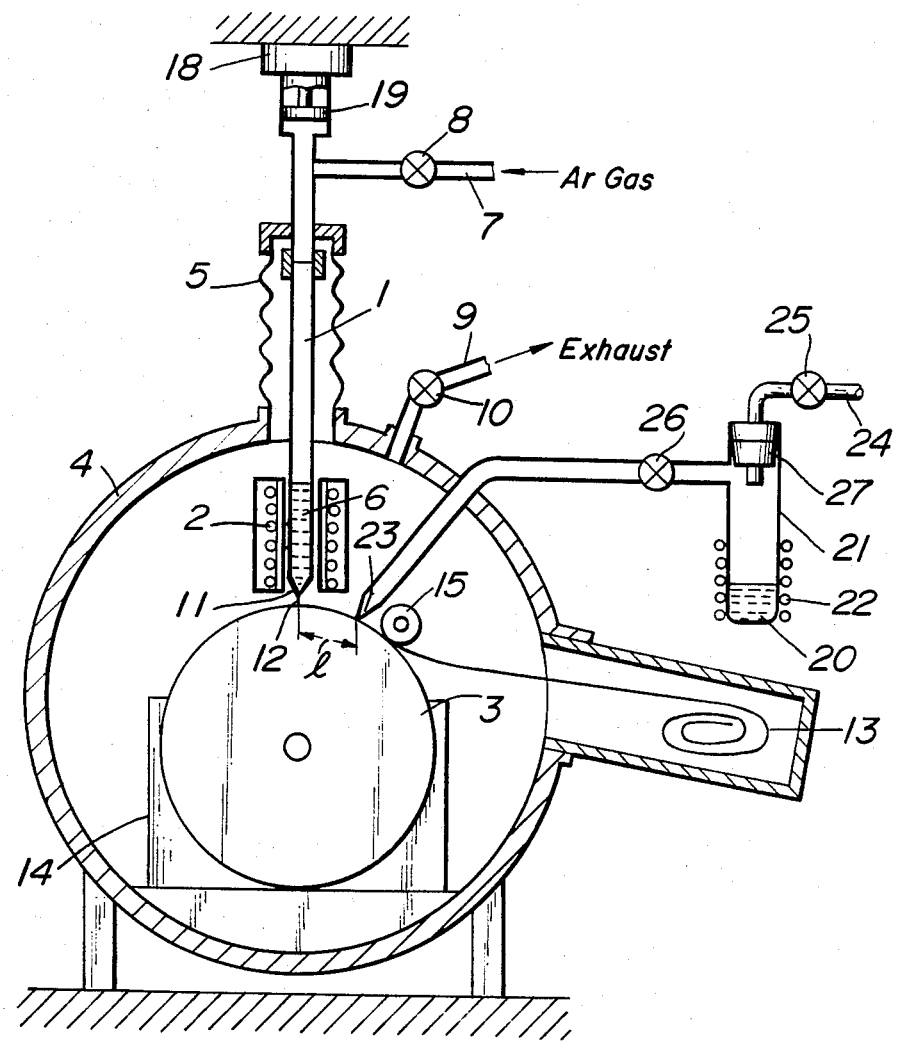
FIG. 2 is a schematic sectional view similar to FIG. 1, illustrating an apparatus with an impurity sprayer suitable for carrying out the process according to the present invention.

The invention uses the super-rapid melt cooling method, in which the starting raw silicon material is melted by heating in a heat-resisting tube, and the thus obtained melt of silicon is ejected onto the circumferential surface of a cooling disk rotating at a high speed or into the interstice between rotating twin rollers, so as to produce a silicon ribbon by super-rapid cooling of the thus ejected melt of silicon. FIG. 1 and FIG. 2 schematically show experimental apparatuses suitable for effecting the process according to the present invention. Referring to FIG. 1, a heat-resisting tube made of quartz is placed in an electric furnace 2, and the electric furnace 2 and a rotary cooling disk 3 coacting with the heat-resisting tube 1 are disposed in a vacuum chamber 4. The vacuum chamber 4 is closed by a bellows 5 after placing a starting raw silicon material 6 in the heat-resisting tube 1. An argon feeder tube 7 with a regulator valve 8 for controlling the argon gas supply is connected to the heat-resisting tube 1 through the bellows 5. The vacuum chamber 4 is evacuated through an exhaust tube 9 with an exhaust regulator valve 10. The heat-resisting tube 1 has a nozzle 11 to project a jet flow of silicon melt 12 to produce a silicon ribbon 13. A driving motor 14 acts on the rotary cooling disk 3 so as to rotate the disk 3.

In the embodiment of FIG. 1, the raw silicon material 6 in the heat-resisting tube 1 is heated by the electric furnace 2 until the raw silicon material 6 is melted. The melt of silicon is ejected onto the circumferential surface of the rotary cooling disk 3 through the nozzle 11. The ejected silicon melt flow 12 is instantly and super-rapidly cooled into a thin ribbon of silicon material 13 in the vacuum chamber 4. The thin ribbon of silicon material 13 thus cooled is forwarded to the contact between the rotary cooling disk 3 and a pinch roller 15, and then freed in the inside space of the vacuum chamber 4. The pinch roller 15 engages an applicator roller 16 which is in contact with impurity material in an impurity vessel 17. The impurity is to form a p-n junction in the thin ribbon of silicon material 13, and the impurity in this embodiment is in liquid- or paste-state and is conveyed from the impurity vessel 17 to the pinch roller 15 through the applicator roller 16 and then transferred and spread onto one side surface of the thin ribbon of silicon material 13. When the impurity is spread, the thin ribbon wafer of silicon material 13 is still at a very high temperature in a range of 600° C. to 1,000° C., immediately after being ejected and cooled super-rapidly, so that the thin ribbon of silicon 13 at this stage is not yet completely solidified. Accordingly, the impurity for the p-n junction is uniformly diffused in the thin ribbon of raw silicon material 13. The silicon ribbon 13 thus produced has a uniform thickness, a constant width, and smooth surfaces.

Once the silicon ribbon 13 is fully solidified by the super-rapid cooling, fine compact crystalline structure is formed therein. Even if an impurity of liquid- or paste-state is applied to the thus crystallized silicon ribbon 13 and the silicon ribbon 13 with the impurity is reheated at about 900° C., it is impossible to form an impurity diffused layer of sufficiently uniform thickness. This is due to the fact that, once the silicon ribbon is cooled to the room temperature and solidified and crystallized, then the reheating merely causes the impurity to diffuse in the crystal grain boundaries in the main, so that the impurity hardly diffuses into crystal nuclei, and an impurity diffused layer with a sufficient thickness for solar cells and the like cannot be formed uniformly.

Instead of the transferring and spreading of the impurity onto a silicon ribbon wafer at a high temperature as shown in FIG. 1, an apparatus in the embodiment of FIG. 2 places the impurity 20 in a heat-resisting tubular vessel 21 which is heated by an electric furnace 22 until the impurity 20 is gasified, so that the impurity 20 in the gas-state is sprayed onto one side surface of the silicon ribbon wafer 13 through a nozzle 23 while the silicon ribbon 13 is still at a high temperature more than 600° C. just after being ejected from the nozzle 11. Whereby, an impurity diffused layer with a sufficient thickness for a p-n junction is uniformly formed on the one side surface of the silicon ribbon 13, so that a silicon ribbon 13 having a p-n junction simultaneously and integrally formed therein is freed into the inside space of the vacuum chamber 4 through the contact between the rotary cooling disk 3 and the pinch roller 15.

In FIG. 2, an argon feeder tube 24 with a valve 25 is connected to the heat-resisting tubular vessel 21 through a plug 27. A valve 26 controls the flow of gaseous impurity between the heat resisting tubular vessel 21 and the nozzle 23. In operation, a suitable impurity 20 such as phosphorus (P) is placed in the heat-resisting tubular vessel 21, and the electric furnace 22 gasifies the impurity 20 by heating. When a certain amount of the gasified impurity 20 is generated in the heat-resisting tubular vessel 21, the valves 25 and 26 are opened, so as to feed the argon (Ar) gas into the heat-resisting tubular vessel 21 while causing the gasified impurity 20 to be sprayed or applied from the nozzle 23 onto one side surface of the silicon ribbon 13 of hot state just formed on the rotary cooling disk 3. Since the silicon ribbon 13 is at a high temperature of more than 600° C. when the gasified impurity 20 is sprayed thereto, the impurity is uniformly diffused in the silicon ribbon 13 to a certain depth from the surface, whereby a p-n junction of high quality is formed in the silicon ribbon 13.

The depth of diffusion of the gasified impurity in the silicon ribbon 13 can be controlled by regulating the distance l between the two nozzles 11 and 23. More particularly, when the inter-nozzle distance l is short, the gasified impurity 20 is sprayed onto the silicon ribbon 13 before the latter is much cooled; namely, the gasified impurity 20 is applied to the silicon ribbon 13 at a temperature on the high side of the range from 600° C. to 1,000° C., and the impurity 20 diffuses well in the silicon ribbon 13, so that the impurity-diffused layer formed on the silicon ribbon 13 becomes deep.

On the other hand, when the inter-nozzle distance l is long, the diffusion of the impurity 20 is limited, and the depth of the impurity diffusion becomes shallow. Accordingly, the preferable distance l between the two nozzles 11 and 23 is 3 to 15 mm. When the distance l is less than 3 mm, the apparatus becomes difficult to fabricate and the impurity applied to the silicon ribbon 13 before the silicon ribbon 13 is cooled below 1,000° C., so that the silicon ribbon 13 of high quality cannot be achieved. Thus, to produce a silicon ribbon 13 of excellent quality, the inter-nozzle distance l must be 3 mm or longer. On the contrary, if the inter-nozzle distance l is longer than 15 mm, the temperature of the silicon ribbon 13 becomes below 600° C. when the impurity 20 is applied thereto, and the diffusion depth of the impurity becomes shallow and the impurity diffusion is limited, so that silicon ribbon 13 of high quality cannot be achieved.

Referring to FIG. 1, the foregoing description of the inter-nozzle distance l is also applicable to the distance from the nozzle 11 for ejecting the melt of silicon to the pinch roller 15 for transferring and spreading the impurity. Accordingly, the pinch roller 15 must be spaced from the nozzle 11 by a distance of 3 to 15 mm.

Figure 3:
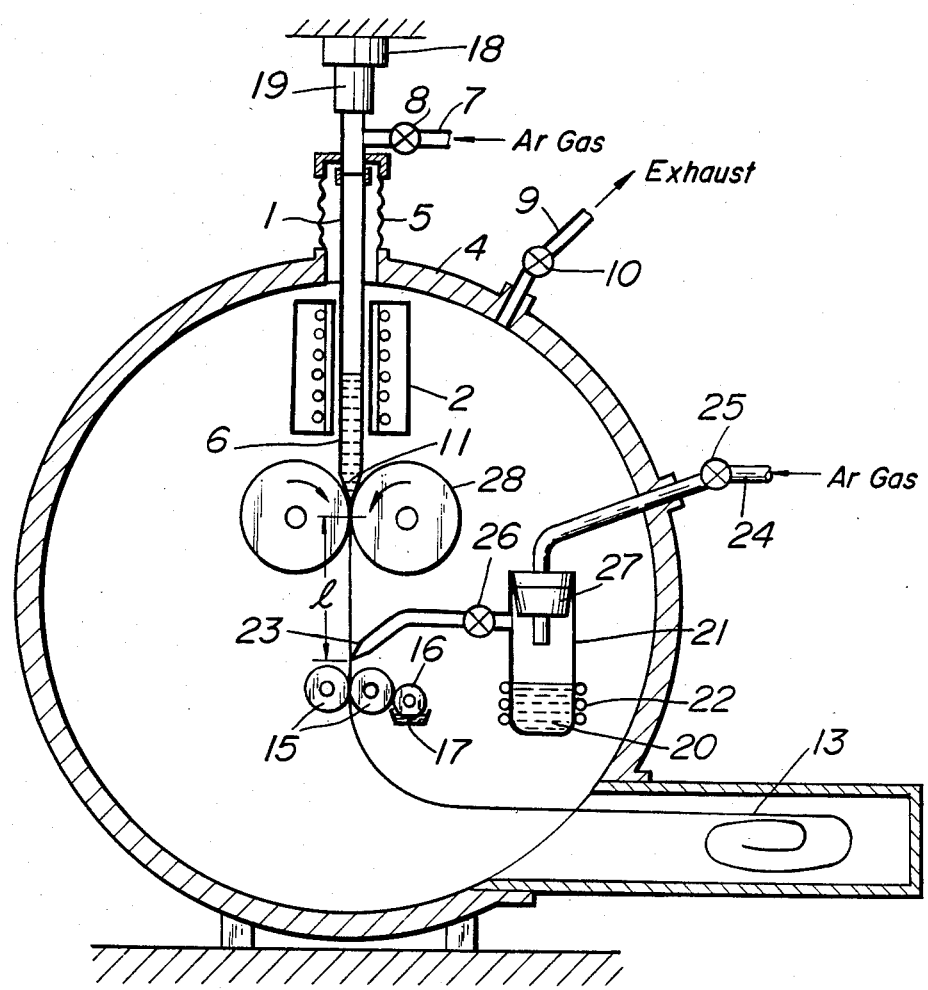
FIG. 3 is a schematic sectional view similar to FIG. 1, illustrating an apparatus with twin rollers suitable for carrying out a spraying process according to the present invention.

FIG. 3 shows an apparatus which uses twin rollers 28 in lieu of the rotary cooling disk 3 of FIG. 2. A nozzle 23 for spraying the gasified impurity is disposed between the twin rollers 28 and a pair of pinch rollers 15. Thus, an impurity layer can be formed on one side surface of a silicon ribbon 13 by spraying the gasified impurity 20 thereto as described hereinbefore by referring to FIG. 3. In the apparatus of FIG. 3, an applicator roller 16 is disposed between an impurity vessel 17 and one of the paired pinch rollers 15 so that an impurity of liquid- or paste-state can be applied to the pinch roller 15 from the impurity vessel 17 by the applicator roller 16 and then the impurity is transferred and spread onto one side surface of the silicon ribbon 13 through the pinch roller 15. Whereby, an impurity-diffused layer of p-type or n-type can be formed on the one side surface of the silicon ribbon 13 simultaneously with the production of the fully solidified silicon ribbon.

According to the present invention, when the melt of silicon is super-rapidly cooled from the melting point of silicon of 1,420° C. to a temperature low enough to produce a solidified silicon ribbon but high enough not to form crystal grains and crystal grain boundaries in the just-solidified silicon ribbon, namely to a temperature of 600° C. to 1,000° C., preferably about 700° C. to 900° C., an impurity of gas- or liquid- or paste-state is sprayed or spread onto one side surface of the silicon ribbon 13. Whereby, the thus sprayed or spread impurity diffuses with a high degree of uniformity to dope, and the impurity-diffused layer of the silicon ribbon 13 becomes thick enough for solar cells and a silicon ribbon 13 having a p-n junction formed therein simultaneously with the production of the fully solidified silicon ribbon can be obtained.

The silicon ribbon with a p-n junction produced by the process according to the invention has better electric and optical characteristics than those of conventional monocrystal silicon ribbon with p-type or n-type layers formed therein. Accordingly, the present invention facilitates high-speed mass production of the silicon ribbon with a p-n junction at a low cost and a high speed, which silicon ribbon is suitable for solar cells, polycrystal substrates, or various other similar devices. Furthermore, as compared with the monocrystal silicon ribbon with a p-n junction of the prior art, the silicon ribbon with a p-n junction according to the present invention has a short-circuit current rating of the equivalent magnitude or larger and a considerably larger open-circuit output voltage and a larger conversion efficiency in terms of that of solar cells. Especially, the short-circuit current (the light short-circuit current) of the silicon ribbon of the present invention in response to incident sunlight is remarkably larger than that of the prior art. As to the spectral distribution of the short-circuit current, that of the present invention is larger than that of the prior art at any wavelength. The solar cells made of the silicon ribbon of the present invention show excellent sensitivity to light rays of various wavelengths ranging from ultraviolet rays to infrared rays.

The process of producing a silicon ribbon with a p-n junction according to the present invention will be described in further detail now, with emphasis on the super-rapid formation of a silicon ribbon itself and application of an impurity to form a p-n junction in the silicon ribbon.

In the method of the present invention, a silicon ribbon of p-type or n-type is produced by the melt super-rapid cooling method; namely, by melting silicon material containing a p-type or n-type impurity as a starting material and ejecting the thus melt of raw silicon material through a nozzle onto a moving cooling substrate. The ejecting of the melt through the nozzle must be under a predetermined suitable pressure. The preferable range of pressure for the ejecting is in a range of 0.01 to 1.5 atm (atmospheric pressure). If the ejecting pressure is higher than 1.5 atm or lower than 0.01 atm, the contour of the resulted silicon ribbon becomes uneven and unsuitable for practical use.

The starting raw molten silicon material may be doped with an impurity depending on whether p-type or n-type silicon ribbon is produced; namely, the raw silicon material may be doped with a p-type impurity at a regular concentration known to those skilled in the art, such as boron (B), gallium (Ga), indium (In), aluminum (Al), thallium (Tl), zinc (Zn), or nickel (Ni); or the raw silicon material may be doped with an n-type impurity at a regular concentration known to those skilled in the art, such as phosphorus (P), arsenic (As), antimony (Sb), bismuth (Bi), tantalum (Ta), sulphur (S), selenium (Se) or tellurium (Te). The above-mentioned elements can be in the form of compound, intermetallic compound or alloy which can be obtained through various known processes. Instead, pure silicon may be placed in a heat-resisting tube or a crucible together with a p-type or n-type impurity selected from known dopants at a rate corresponding to a regular concentration known to those skilled in the art, so that when the mixture of the raw silicon material and the impurity in the heat-resisting tube or crucible is melted by a furnace, a molten raw silicon material containing the desired amount of the impurity can be obtained.

The heat-resisting tube can be, for instance, a crucible with a nozzle bored at the lower end thereof. The material of the heat-resisting tube can be quartz, alumina, or the like. The shape and dimension of the nozzle at the lower end of the heat-resisting tube can be selected from a wide range. A wide variety of heating systems, heating conditions, and heating atmospheres can be selectively used to melt the material in the heat-resisting tube so as to obtain the desired molten starting raw silicon material. For instance, an electric resistance heater of direct type or indirect type can be used. The speed of heating can be selected from the conditions regularly used in conjunction with the rapid cooling of liquid alloys or the like. At the time of ejecting through the nozzle, the temperature of melt of raw silicon material is higher than the melting point thereof (for instance, 1,420° C. in the case of high purity under atmospheric pressure), preferably in a temperature range from the melting point to 200° C. above the melting point. The starting raw silicon material can be melted in air, but an inert gas atmosphere such as that of argon (Ar) or helium (He) is more preferable for the melting of the starting raw silicon material.

The melt of raw silicon material thus prepared is ejected through a nozzle. A typical method to actuate the ejecting through the nozzle is to apply a pressurized inert gas such as argon to the top surface of the melt of silicon material through an opening at the end of the heat-resisting tube, so that the melt of raw silicon material is ejected through the nozzle at the lower end of the heat-resisting tube by the pressure of the inert gas at the top thereof. The pressurizing conditions which determine the ejecting speed of the melt of silicon material can be selected from a wide range depending on the specific requirements for actual use.

After ejecting, the melt of silicon material immediately comes in contact with a cooling substrate and is instantly cooled and solidified so as to run as a silicon ribbon. The cooling conditions for the melt of raw silicon material can be selected from those of various known rapid cooling processes. For instance, the spacing from the nozzle to the cooling substrate can be about 0.1 to 10 mm in general. It is preferable to move the cooling substrate always in one preselected direction relative to the nozzle. To this end, the cooling substrate is generally in the form of a rotary substrate. Thus, a rotary cylinder or rotary disk of any known type can be used as the cooling substrate, and the melt of silicon material can be ejected toward the circumferential surface of the rotary cylinder or rotary disk. Other forms of the rotary cooling substrate are also possible: for instance, the rotary cooling substrate can be constructed by twin rollers rotating side by side in opposite directions and the melt of raw silicon material can be ejected toward the interstice between the twin rollers; or the rotary cooling substrate can be constructed by an endless belt running between two rotary rollers or a combination of a belt being paid out and a rotary roller in contact with the belt thus paid out, so that the melt of raw silicon material can be ejected onto the belt.

In the process of the invention, the cooling substrate must move relative to the nozzle preferably at a speed of not less than 1 cm/second, more preferably at a speed of 1 to $10^4$ cm/second. Rotary cooling disks or rotary cylindrical rollers of various sizes can be used, but the preferable diameter of such disks or cylindrical rollers is generally in a range of several centimeters to two hundred centimeters, and the disks or the rollers may revolve at a rate of 10 to 10,000 r.p.m. The material of the rotary cooling substrate can be selected from a wide variety: for instance, metals such as stainless steel, copper (Cu), cast iron, tungsten (W), or molybdenum (Mo), silicon compounds such as silicon carbide (SiC), silicon nitride, or silicon oxide ($SiO_2$), ceramics such as alumina, or amorphous material such as glass. The cooling of the ejected melt of silicon can be carried out in air, in vacuo, or in an inert gas atmosphere. When cooled in air, the silicon ribbon may have an oxide layer of about 60 Å thickness formed on the surface thereof, but such oxide layer can be easily removed for instance by using an aqueous solution of hydrofluoric acid, so that there is no difficulty in practical use. No separate cooling means is necessary to cool the abovementioned cooling substrate, but the temperature of the cooling substrate may be controlled by water cooling or by heating.

When coming in contact with the surface of the cooling substrate whose temperature is preferably controlled in the manner mentioned above, the melt of raw silicon material is cooled at a rate of about $10°$ to $10^{6°}$ C./second and solidifed into a thin ribbon wafer of silicon. The silicon ribbon wafer thus solidified runs due to the centrifugal force given at the surface of the rotary cooling substrate or the rolling force at the twin rollers. For instance, a typical silicon ribbon thus produced is a crystallized ribbon with a thickness of 5 μm to 1 mm, contains p-type or n-type impurity atoms at a concentration of about $10^{12}$ to $10^{22}$ cm$^{-3}$, and has a specific resistance of about $10^4$ to $10^{-2}$ Ω·cm.

To obtain a silicon ribbon of high quality, the nozzle should be made of a material which hardly react with the melt of raw silicon material. In the case of ejecting the melt of raw silicon material in vacuo or in an inert gas atmosphere such as argon in reduced pressure, the nozzle is preferably made of carbon (C), tungsten (W), molybdenum (Mo), molybdenum alloys or boron nitride.

The shape of the nozzle tip is determined depending on the desired width of the silicon ribbon to be produced, and it can be circular, elliptic or slit-like. To obtain a silicon ribbon with a large width, the nozzle must have a wide width and the shape of the nozzle opening must be properly selected.

It is noted that if the inner surface of the nozzle is lined with boron nitride, the melt of silicon material is prevented from plugging the nozzle opening and the melt of raw silicon material is smoothly ejected so as to ensure continuous operation of the apparatus.

Super-rapid cooling of the melt of raw silicon material ejected onto the surface of the rotary cooling substrate is indispensable for producing a silicon ribbon of high quality, and the rotary cooling substrate must have a high heat conductivity and a high machine workability. The material of the cooling substrate can be copper (Cu), copper alloys, aluminium (Al), iron (Fe), steel, stainless steel, fused silica or ceramics.

As regards the application of an impurity to form a p-n junction in the silicon ribbon, p-type or n-type impurity in the form of solution using a solvent such as silicon tetrachloride ($SiCl_4$), acetic acid ($CH_3COOH$), or ethyl alcohol ($C_2H_5OH$) can be spread onto the surface of the silicon ribbon of n-type or p-type. A p-type impurity such as tripropoxy borane ($B(C_3H_7O)_3$) or an n-type impurity such as phosphorus pentoxide ($P_2O_5$) can be applied to the silicon ribbon. The solution of the above-mentioned impurity is spread on one side surface of the silicon ribbon directly or after diluting it with ethyl alcohol ($C_2H_5OH$), and upon being heated and dried, a p-type or n-type layer is formed on that one side surface of the silicon ribbon of the n-type or p-type in the form of a layer containing silicon dioxide ($SiO_2$), whereby a p-n junction is formed therein. The p-type impurity is not limited to the above-mentioned boron (B) but other elements such as gallium (Ga), and indium (In) or a suitable combination thereof can be also used as the p-type impurity. Similarly, the n-type impurity is not limited to the above-mentioned phosphorus (P), but other elements such as arsenic (As) and antimony (Sb) or a suitable combination thereof can be also used as the n-type impurity. The impurity of gas-state can be also used to form a p-n junction in the silicon ribbon.

The silicon ribbon with a p-n junction thus produced by the process according to the present invention can be subjected to further processing of known type, so as to fabricate the silicon ribbon into a photoelectric conversion device with excellent characteristics such as a solar cell, a photoelectric cell, a photodiode, or the like device, or a photosensitive electrode for a hydrogen generator.

Further details of the present invention will be described by referring to examples.

EXAMPLES

To produce samples of the silicon ribbon with a p-n junction formed therein by the process of the invention, the starting raw silicon material 6 of p-type and n-type, each material having a 3 mm by 3 mm square cross section and a length of 30 mm, were prepared and placed in a heat-resisting tube 1 made of quartz having 8 mm diameter as shown in FIGS. 1 through 3. Both the p-type starting raw silicon material and the n-type starting raw silicon material has a specific resistance of 1 Ω·cm. The heat-resisting tube 1 carrying the starting raw silicon material 6 was heated in an electric furnace 2 made by using silicon carbide, so that the raw silicon material therein was molten. The argon gas pressure in the heat-resisting tube 1 was suddenly raised to eject the melt of raw silicon material through the nozzle 11 with a diameter of 1.2 to 2 mm bored at the lower end of the tube 1.

In the case of some samples, the uniform jet stream 12 of the melt of raw silicon material from the nozzle 11 was directed to the circumferential surface of a rotary cooling disk 3 made of stainless steel with a diameter of 300 mm and a thickness of 10 mm, as shown in FIG. 1 or 2. While in the case of some other samples, the uniform jet stream 12 was directed to the interstice between twin rollers 28 made of stainless steel with a diameter of 60 mm and a thickness of 5 mm, as shown in FIG. 3.

Phosphorus (P) or mercury (Hg) was evaporated and the gasified phosphorus (P) or mercury (Hg) was sprayed to the silicon ribbon 13 through the nozzle 23 while the silicon ribbon 13 was still at a high temperature, as shown in FIG. 2 or FIG. 3. In the case of the arrangement of FIG. 2, the nozzle 23 was disposed in the proximity of the disk 3, and in the case of the arrangement of FIG. 3, the nozzle 23 was disposed in the proximity of the twin rollers 28. For certain samples, a stainless steel pinch roller 15 with a diameter of 10 cm was kept in contact with the rotary cooling disk 3 and turned in the opposite direction to the revolving direction of the disk 3, as shown in FIG. 1, so that an impurity such as boron tribromide (BBr$_3$) was fed from an impurity vessel 17 to the pinch roller 15 through a stainless steel applicator roller 16 and spread onto a silicon ribbon 13 from the pinch roller 15 while the silicon ribbon 13 was still at a high temperature of more than 600° C. just after being solidified. For still other samples, a pair of stainless steel pinch rollers 15, each having a diameter of 10 cm, were brought into contact with a silicon ribbon 13 just formed from the melt of silicon by the twin rollers 28, as shown in FIG. 3, and an impurity such as boron tribromide (BBr$_3$) from the applicator roller 16 was spread onto the silicon ribbon 13 through the pinch roller 15.

The samples of the silicon ribbon were prepared in the above-mentioned manner while changing various conditions, such as the temperature of the melt of raw silicon material at the time of ejecting, the nozzle size, and the argon gas pressure. The samples thus prepared were cut, and the surface and the cross section of each sample were ground by a grinding machine and etched by using a solution of hydrofluoric acid and nitric acid. The surface conditions of the silicon ribbon, the crystal grains in the silicon ribbon, and the surfaces of the p-region and the n-region were checked by inspection. The voltage-current (V-I) characteristics of the samples of the silicon ribbon, with a p-n junction or Schottky barrier formed therein by spraying the gasified impurity or spreading the liquid impurity immediately after formation or solidification of the silicon ribbon were measured.

Figure 4A:
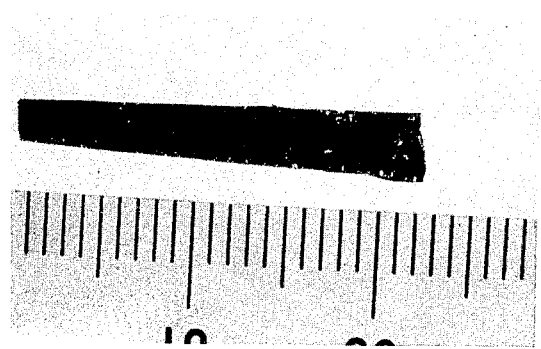
FIGS. 4A and 4B are microscopic photographs illustrating the relationship between the temperature of the melt of raw silicon material at the time of ejecting and the surface conditions of a silicon ribbon formed on the cooling substrate.
Figure 4B:
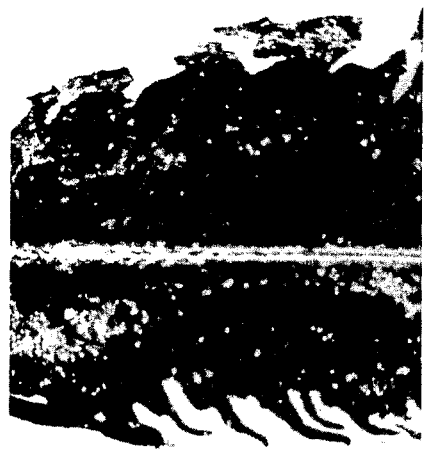

The result of the inspection showed that for both the rotary cooling disk 3 and the twin rollers 28, if the temperature of the melt of raw silicon material at the time of ejecting was kept at least 0.5° C. above the melting point (1,410° C.) of the raw silicon material, the viscosity of the melt of silicon was so reduced that the melt of silicon material could be easily ejected through the nozzle 11. FIG. 4A shows the cross section of the silicon ribbon sample which was made by ejecting the melt of silicon at a comparatively low temperature of 1,430° C., while FIG. 4B shows the cross section of the silicon ribbon which was made by ejecting the melt of raw silicon material at a comparatively high temperature of more than 1,440° C. It was concluded from the inspection of silicon ribbon samples, as shown in FIGS. 4A and 4B, that the shape of the silicon ribbon thus prepared varied considerably with the change of the temperature of melt of raw silicon material at the time of ejecting but was not affected significantly by the change of the nozzle diameter and the argon gas pressure. More particularly, when the temperature of the melt of raw silicon material was comparatively low at the time of ejecting, e.g., at 1,430° C., the silicon ribbon produced had a very uniform width, very smooth surface, and linear ribbon edges, as shown in FIG. 4A. On the other hand, when the temperature of the melt of raw silicon material at the time of ejecting was raised to more than 1,440° C., the ribbon width increased considerably, and cedar-leaf-like notchy edges were formed, so that uniform width of ribbon was not obtained. In some samples, projection of several tens of μm appeared at the notchy edges of the silicon ribbon.

FIG. 5 summarizes the result of the inspection. In FIG. 5, the region (1) represents the conditions for producing silicon ribbon with smooth surfaces and uniform widths, and the region (2) represents the conditions for producing wide silicon ribbon with the cedar-leaf-like edges and projections formed on the surfaces thereof, while the region (3) represents the conditions for producing the wide silicon ribbon with the cedar-leaf-like edges. In the figure, the different marks represent the process conditions and the result as shown in the following table.

| Argon gas pressure | Symbols in FIG. 5 | | |
|---|---|---|---|
| | 1.0 atm | 0.8 atm | 0.6 atm |
| Silicon ribbon formed | ○ | ⊙ | ● |
| Silicon ribbon not formed | △ | ▲ | |
| No ejection from nozzle | | x | ▲ |

As can be seen from FIG. 5, the production of a silicon ribbon wih smooth surfaces and a constant width is ruled by the viscosity of the melt of silicon at the time of ejecting, but not ruled by the nozzle diameter for ejecting the melt of silicon and the argon gas pressure for actuating the ejecting. The suitable temperature range of the melt of raw silicon material at the time of ejecting is from 0.5° C. above the melting point of the raw silicon material, i.e., the temperature at which ejecting becomes possible, to 20° C. above the melting point.

Figure 6:
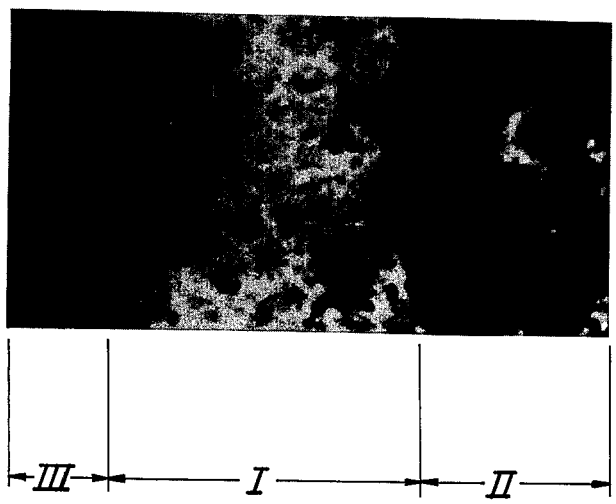
FIG. 6 is a microscopic photograph of an obliquely cut surface of a silicon ribbon with a p-n junction produced by the process of the present invention.

One of the silicon ribbon samples was made by using a starting raw silicon material 6 with a specific resistance of 1 Ω·cm and doped with a p-type impurity of boron (B) at a rate of $1.9 \times 10^{16}$ atoms per cm$^3$. The starting raw silicon material was molten at 1,430° C. and ejected onto the circumferential surface of a stainless steel cooling disk 3 of 30 cm which was revolving at 3,000 r.p.m. Phosphorus (P) was placed in a heat-resisting tubular vessel 21 and evaporated by heating at 1000° C. The thus evaporated phosphorus (P) gas was sprayed onto a silicon ribbon 13 by the above-mentioned ejecting when the ribbon 13 was still on the disk 3 and at a temperature of about 1,000° C. Whereby, a silicon ribbon 3 with a p-n junction formed therein was obtained, and the silicon ribbon 13 was cut at an angle of about 5° relative to the length direction of the ribbon 13. The surface thus cut was etched by staining, and FIG. 6 shows a microscopic photograph of the surface thus stained. In FIG. 6, the white region I represents the p-type silicon, and the black region II represents the n-type silicon substrate, while the other black region III represents the free space. That surface of the silicon ribbon 13 to which phosphorus (P) gas was sprayed when the silicon ribbon was still at a high temperature was converted into an n-region. Whereby, a p-n junction was formed between the n-region thus converted and the non-converted p-region, as proved by the microscopic photograph of FIG. 6.

Figure 7:
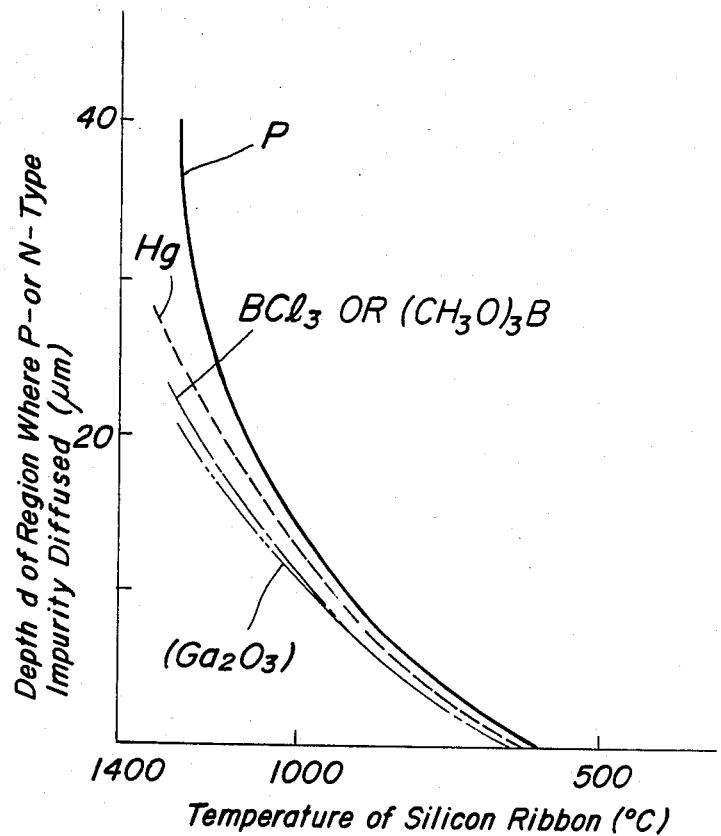
FIG. 7 is a graph showing the relationship between the temperature of the just-ejected silicon ribbon at the time of impurity application thereto and the depth of a region of the silicon ribbon where the p-type or n-type impurity is diffused.
Figure 7A:
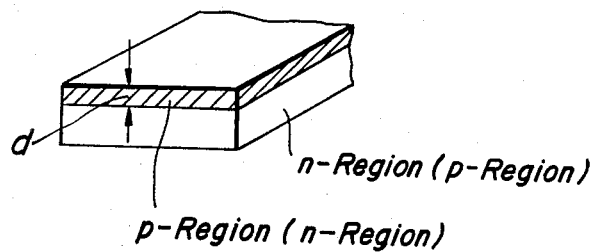
FIG. 7A is an explanatory diagram for the graph of FIG. 7.

The depth d of the p-n junction as shown in FIG. 7A varied depending on the temperature of the silicon ribbon 13 when the phosphorus (P) was sprayed thereto. As can be seen from the solid line curve of FIG. 7, when the spraying was effected at the silicon ribbon temperature of 1,300° C., the n-region was formed to the depth of about 40 μm. As the silicon ribbon temperature at the time of phosphorus (P) spraying was reduced, the depth d was reduced, and for spraying at 600° C., the depth d became less than 0.1 μm and practically no n-region was formed. Such change in the depth d is due to the fact the diffusion of the n-type impurity such as (P) into the p-type ribbon substrate II is suppressed with the reduction of the silicon ribbon temperature.

The dashed line of FIG. 7 represents the depth d of a p-region formed in an n-type substrate. More particularly, a starting raw silicon material 6 with a specific resistance of $10^{-2}$ Ω·cm and containing an n-type impurity of antimony (Sb) at a rate of $9 \times 10^{15}$ atoms per cm³ was processed into a silicon ribbon in the same manner as the preceding sample represented by the solid line of FIG. 7. Mercury (Hg) was gasified at 600° C., and the mercury (Hg) gas thus evaporated was sprayed onto the n-type silicon ribbon at different temperatures to form a p-region of depth d in the n-type ribbon. The dashed line of FIG. 7 shows the relationship between the depth d of the thus formed p-region and the temperature of the n-type silicon ribbon 13 at which the mercury (Hg) gas was sprayed thereto; namely, the depth d was 24 μm for spraying at 1,300° C., but the depth d was only 0.05 μm for spraying at 600° C.

The dash-dot line and the dash-dot-dot line of FIG. 7 refer to n-type silicon ribbon substrates having a specific resistance of 10 Ω·cm and containing an n-type impurity at a rate of $10 \times 10^{15}$ atoms per cm³, which silicon ribbon were prepared by the twin roller revolving at 1,000 r.p.m. The dash-dot line represents the depth d of the p-region formed on the n-type substrate by spraying boron trichloride (BCl₃) gas or trimethoxy borane (B(CH₃O)₃) gas evaporated at 700° C. The dash-dot-dot line of FIG. 7 represents the depth d of the p-region formed in the n-type substrate by spraying gallium oxide (Ga₂O₃) gas evaporated at 700° C. There was not any substantial difference between the boron trichloride (BCl₃) case and the trimethoxy borane (B(CH₃O)₃) case, and the p-region made by gallium oxide (Ga₂O₃) was thinner than that made by boron (B). Generally speaking, it is known that the depth d of a p-n junction in a silicon photovoltaic element for solar cells must be 0.1 μm or deeper. Accordingly, although there are certain variations due to difference in the kind of the impurities to be diffused or compounds to be evaporated, the spraying of the impurity vapor to a silicon ribbon at a temperature of 600° C. or higher is very effective in forming the p-n junction, while the spraying at a temperature below 600° C. is not effective because the p-n junction formed thereby is too thin.

Figure 8:
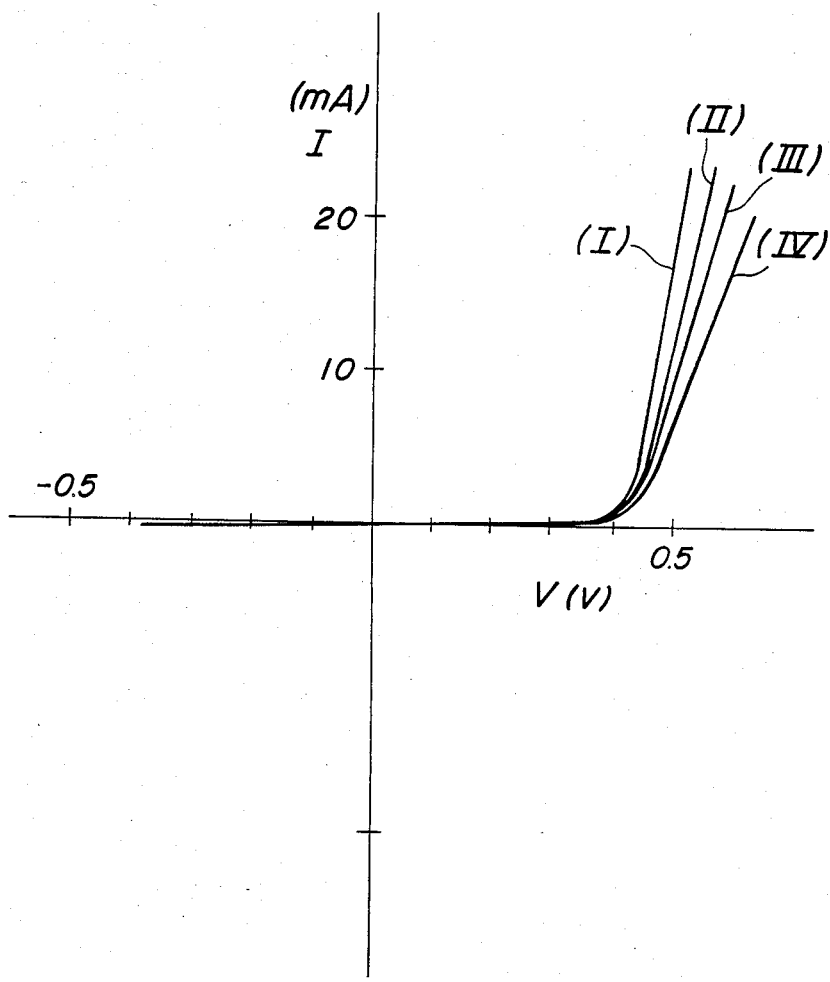
FIG. 8 is a graph showing the voltage-current (V-I) characteristics curves of solar cells composed of the silicon ribbon with p-n junctions produced by the process according to the present invention.

The curves (I), (II), and (III) of FIG. 8 show the V-I characteristics of silicon ribbon samples made by using starting raw silicon material of n-type containing phosphorus (P) and having a specific resistance of 0.1 Ω·cm: the samples were prepared by melting the raw silicon material at 1,420° C., ejecting the melt of raw silicon material onto a cooling disk revolving at 3,000 r.p.m., and spreading a methyl alcohol (CH₃OH) solution of one of the following p- or n-type impurities onto each silicon ribbon just produced at about 800° C. by using an applicator roller and a pinch roller so as to directly diffuse the impurity in the silicon ribbon. The above-mentioned impurities were boron tribromide (BBr₃), boron oxide (B₂O₃), phosphoryl chloride (POCl₃), and phosphorus trichloride (PCl₃), for the curve (I); indium oxide (In₂O₃), antimony tetroxide (Sb₂O₄), lithium hydroxide (LiOH), phosphorus pentoxide (P₂O₅), and arsenic trioxide (As₂O₃) for the curve (II); and titanium trioxide (Ti₂O₃), iron trichloride (FeCl₃), and bismuth oxide (Bi₂O₃) for the curve (III).

The curve (IV) of FIG. 8 shows the V-I characteristics of silicon ribbon samples using starting raw silicon material of p-type containing boron (B) and having a specific resistance of 0.1 Ω·cm: the samples were prepared by melting the raw silicon material at 1,430° C., ejecting the melt of raw silicon material onto twin rollers of FIG. 3 revolving at 1,000 r.p.m., and spreading methyl alcohol (CH₃OH) solution of one of the following n-type impurities onto each silicon ribbon just produced at about 800° C. by using an applicator roller and a pair of pinch rollers so as to directly diffuse the impurity into the silicon ribbon. The above-mentioned impurities for the curve (IV) were arsenic trioxide (As₂O₃), bismuth oxide (Bi₂O₃), antimony trioxide (Sb₂O₃), antimony tetroxide (Sb₂O₄), antimony pentoxide (Sb₂O₅), phosphorus pentoxide (P₂O₅), antimony pentachloride (Sb₃Cl₅), iron trichloride (FeCl₃), phosphoryl chloride (POCl₃), phosphorus trichloride (PCl₃), and lithium hydroxide (LiOH).

The curves (I), (II), (III), and (IV) of FIG. 8 showed very good rectifying characteristics, so that it was confirmed that the silicon ribbon samples represented by such curves had excellent p-n junctions formed therein.

Furthermore, silicon ribbon samples with Schottky barriers were prepared by spreading p-type impurities onto n-type silicon ribbon by using an applicator roller and a pinch roller, which impurities were in the form of methyl alcohol (CH₃OH) solutions containing aluminum (Al), indium (In), or gallium (Ga). The samples with Schottky barriers showed excellent rectifying characteristics as shown in the curve (I) of FIG. 8.

Thus, the inventors have succeeded in forming a p-n junction at a high speed in a silicon ribbon produced by the super-rapid melt cooling method. More particularly, the melt of raw silicon material was ejected so as to form it into a silicon ribbon by using either a cooling disk means or twin rollers, and an impurity of n-type or p-type in the form of an element or a compound was applied to the thus ejected silicon ribbon when the silicon ribbon wafer is still at a temperature of 600° C. or higher. The impurity was either in gas-state for spraying onto the silicon ribbon or in liquid-state for transferring and spreading onto the silicon ribbon through an applicator roller and a pinch roller. In order to improve the smoothness of the silicon ribbon surface, the linearity of the silicon ribbon edges, and the uniformity of the silicon ribbon width, tests were made by changing the temperature of the melt of raw silicon material at the time of ejecting and the argon gas pressure.

Conventional processes of producing p-n junctions such as the CVD gas-phase diffusion method require complicated treatments and take much time, because the conventional processes include steps of cracking a gas of silane ($SiH_4$), phosphine ($PH_3$), diborane ($B_2H_6$), or hydrogen ($H_2$) by heating or by using plasma, spreading the impurity such as phosphorus (P) or boron (B) onto the surface of the silicon ribbon kept at a high temperature, thermally decomposing a solvent and diffusing the impurity in the silicon ribbon by heating at 900° C. for about 30 minutes, so as to form a p-n junction therein. On the other hand, in the process according to the present invention, the heat of the silicon ribbon itself under formation is used to thermally crack a solvent and thermally diffuse the impurity such as phosphorus (P) into the silicon ribbon; more particularly, after the melt of silicon is ejected onto a rotary cooling disk means or twin rollers for super-rapid cooling to formulate a silicon ribbon, an impurity is applied to the silicon ribbon while the silicon ribbon is still at a high temperature of 600° C. or higher, which impurity is either in gas-state such as phosphorus (P) or mercury (Hg) gas to be directly sprayed onto the silicon ribbon or in liquid-state such as phosphorus pentoxide ($P_2O_5$) dissolved in a solvent like methyl alcohol ($CH_3COOH$) or silicon tetrachloride ($SiCl_4$) for spreading onto the surface of the silicon ribbon. Accordingly, the process of the present invention succeeds in forming a p-n junction or a Schottky barrier in a silicon ribbon simultaneously with the production of the silicon ribbon itself as a fully solidified product, so that the need of reheating the silicon ribbon is completely eliminated while facilitating high-speed formation of a p-n junction or Schottky barrier simultaneously with the production of fully solidified silicon ribbon. Thus, a feature of the present invention is to drastically reduce the cost of a silicon ribbon with a p-n junction or Schottky barrier formed therein, which silicon ribbon is suitable for solar cells.

During the ejecting, if the melt of raw silicon material is kept at a temperature in a range from 0.5° C. above the melting point of the raw silicon material to 20° C. above the melting point of the raw silicon material, silicon ribbon with excellent characteristics can be obtained. On the other hand, if the temperature of the melt of raw silicon material during the ejecting is higher than the above-mentioned range, the viscosity of the melt of raw silicon material becomes too low and the resultant silicon ribbon becomes wider with cedar-leaf-like edges and projections are formed on the ribbon surfaces to make the surfaces uneven. The invention is based on the finding that, if the temperature of the molten silicon material during the ejecting is kept higher than 0.5° C. above the melting point of the raw silicon material but lower than 20° C. above the melting point of the raw silicon material, a silicon ribbon having a uniform width and smooth surfaces can be obtained, to which silicon ribbon a barrier such as a p-n junction or a Schottky barrier can be easily formed to meet requirements for solar cells.

Although the invention has been described with a certain degree of particularity, it is understood that the present disclosure has been made only by way of example and that numerous changes in details of the process and the apparatus may be restorted to without departing from the scope of the invention as hereinafter claimed.

What is claimed is:

1. A process of producing a silicon ribbon with a p-n junction, comprising the steps of melting a raw silicon material having a polarity of the p- or n-type in a heat-resisting tube at a temperature higher than 0.5° C. and lower than 20° C. above the melting point of the raw silicon material, ejecting the melt of raw silicon material onto a rotary cooling substrate, cooling the melt super-rapidly so as to produce a silicon ribbon, and doping an impurity having a polarity of the p- or n-type and whose polarity is opposite to that of the raw silicon material onto the silicon ribbon thus ejected while the silicon ribbon is still at a temperature of 600° C. to 1,000° C. by applying dopant in a gaseous, liquid or paste state, whereby a p-n junction is formed in the silicon ribbon during the course of fully solidifying the silicon ribbon.

2. A process as set forth in claim 1, wherein said raw silicon material is of n-type and produced by addition of an n-type impurity selected from the group consisting of phosphorus, arsenic, antimony, bismuth, tantalum, sulphur, selenium, and tellurium, and said impurity applied to said silicon ribbon wafer is of p-type.

3. A process as set forth in claim 1, wherein said raw silicon material is of p-type and produced by addition of a p-type impurity selected from the group consisting of boron, gallium, indium, aluminum, thallium, zinc, and nickel, and said impurity applied to said silicon ribbon wafer is of n-type.

4. A process as set forth in claim 1, wherein said melt of raw silicon material is ejected through a nozzle defined at that lower end of said heat-resisting tube.

5. A process as set forth in claim 4, wherein said impurity is sprayed onto said silicon ribbon wafer through a nozzle spaced from said ejecting nozzle of the melt of raw silicon material by a distance of 3 to 15 mm.

6. A process as set forth in claim 1, wherein said melt of raw silicon material is ejected onto said rotary cooling substrate kept in a vacuum chamber.

7. A process as set forth in claim 1, wherein, said melt of raw silicon material is ejected onto said rotary cooling substrate kept in an argon atmosphere.

8. A process as set forth in claim 1, wherein said impurity is in gas-state and is applied to the silicon ribbon wafer by spraying.

9. A process as set forth in claim 1, wherein said melt of raw silicon material is ejected by applying a pressure of 0.01 to 1.5 atm thereto.

10. A process of producing a silicon ribbon with a p-n junction, comprising the steps of melting a raw silicon material in a heat-resisting tube at a temperature 0.5° C. to 20° C. above the melting point of the raw silicon material, ejecting the molten silicon material onto a rotary cooling substrate in a range of 0.01–1.5 atmospheric pressure so as to produce a silicon ribbon by super-rapid cooling, and doping an impurity whose polarity is opposite to that of the raw silicon material onto the silicon ribbon thus ejected while the silicon ribbon is maintained at a temperature of 600° C. to 1,000° C. at a delayed position from the contact point of the melt with the cooling substrate by a distance l of 3 to 15 mm, so as to form a p-n junction in the silicon ribbon simultaneously with the production of the fully solidified silicon ribbon.

* * * * *